United States Patent
Wu et al.

(10) Patent No.: US 6,281,061 B1
(45) Date of Patent: Aug. 28, 2001

(54) METHOD FOR FABRICATING AN ISOLATION TRENCH APPLIED IN BiCMOS PROCESSES

(75) Inventors: Cheng-Hsu Wu; Chin Liang Chen, both of Hsin-Chu (TW)

(73) Assignee: United Microelectronics Corp, Hsin-Chu (TW)

( * ) Notice: Subject to any disclaimer, the term of this patent is extended or adjusted under 35 U.S.C. 154(b) by 0 days.

(21) Appl. No.: 09/575,566

(22) Filed: May 22, 2000

(30) Foreign Application Priority Data

Dec. 9, 1999 (TW) .................................................. 88121584

(51) Int. Cl.[7] .............................................. H01L 21/8238
(52) U.S. Cl. .......................... 438/207; 438/202; 438/234
(58) Field of Search ..................................... 438/207, 202, 438/234, 203, 204, 205, 481

(56) References Cited

U.S. PATENT DOCUMENTS 5,057,455 * 10/1991 Foo et al. .
5,258,318 * 11/1993 Buti et al. .
5,356,822 * 10/1994 Lin et al. .
5,405,790 * 4/1995 Rahim et al. .

* cited by examiner

Primary Examiner—Tuan H. Nguyen
(74) Attorney, Agent, or Firm—Darby & Darby (57) ABSTRACT

The present invention discloses a method for fabricating isolation trenches applied in BiCMOS processes. The isolation trenches are formed initially by defining an oxide layer formed on a semiconductor substrate. Then an epitaxy layer is formed on the substrate and a polysilicon layer is formed on the oxide layer by selective epitaxial growth (SEG). After forming well regions and a collector region in the epitaxy layer, the polysilicon layer is etched and stopped at the oxide layer such that trenches are formed. Subsequently, an isolating material is filled into the trenches to form isolation trenches. It is noted that the oxide layer definition, the epitaxy layer and the polysilicon layer growth by SEG, and the polysilicon etching processes simplify the process of forming isolation trenches. In addition, the integration of the semiconductor is increased, and the isolating effect is good.

11 Claims, 7 Drawing Sheets

METHOD FOR FABRICATING AN ISOLATION TRENCH APPLIED IN BICMOS PROCESSES

BACKGROUND OF THE INVENTION

1. Field of the Invention

The present invention relates to a method for isolating, and more particularly to a method for fabricating an isolation trench applied in BiCMOS processes.

2. Description of the Prior Art

Referring to FIG. 1a to FIG. 1e to FIG. 1a conventional method for fabricating an isolation trench applied in BiCMOS processes is schematically depicted in cross-sectional views.

Figure 1A:
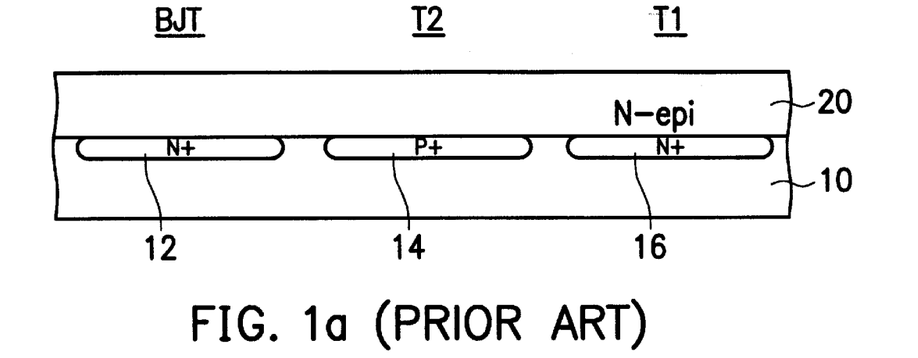
FIG. 1a through FIG. 1f schematically depict in cross-sectional views steps involved in a conventional method for fabricating an isolation trench applied in BiCMOS processes.

Referring to FIG. 1a, a semiconductor substrate 10 such as a P-type silicon substrate 10 is provided. Subsequently, a bipolar junction transistor region BJT, and MOS transistor regions T1 and T2 are defined by the conventional steps of forming a pre-doping oxide layer, alignment, and etching, wherein the MOS transistor region T2 is formed between the bipolar junction transistor region BJT and the MOS transistor region T1. Thereafter, $N^+$-type ions and $P^+$-type ions are doped into the bipolar junction transistor region BJT and the MOS transistor region T1 to form $N^+$-type buried layers 12 and 16, and to form a $P^+$-type buried layer 14 in the MOS transistor region T2, respectively. An epitaxy layer 20 such as an N-type epitaxy layer is then formed on the silicon substrate 10.

Figure 1B:
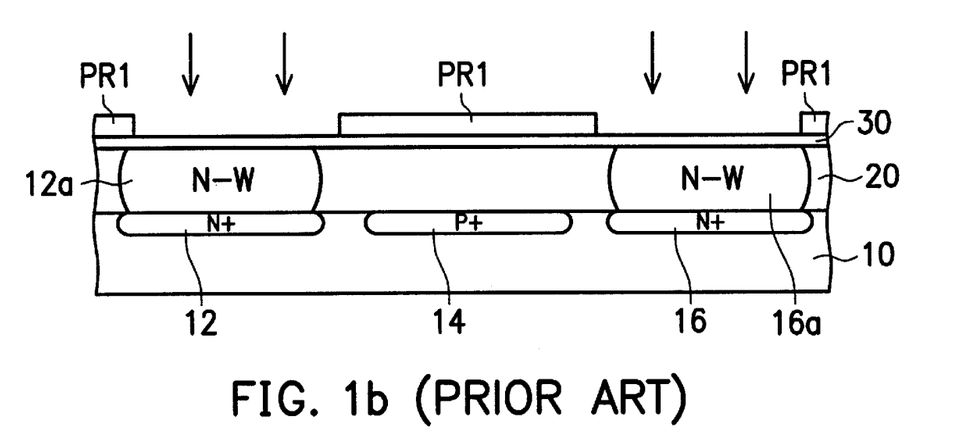

Referring to FIG. 1b, N wells (N-W) 12a and 16a are formed in the epitaxy layer 20 above the N+-type buried layers 12 and 16. For example, a pre-doping oxide layer 30 is formed on the epitaxy layer 20 by thermal oxidation. A photoresist layer (not shown) is then coated on the pre-doping oxide layer 30, and a patterned photoresist layer PR1 is formed by exposure and development steps, so that the pre-doping oxide layer 30 above the $N^+$-type buried layers 12 and 16 is exposed. Subsequently, N wells (N-W) 12a and 16a are formed in the epitaxy layer 20 above the $N^+$-type buried layers 12 and 16 by doping N-type ions into the epitaxy layer 20

Figure 1C:
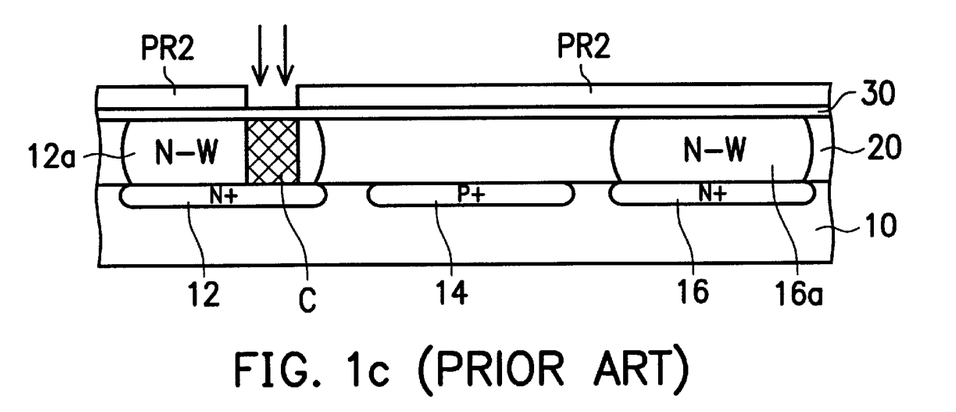

Referring to FIG. 1c, the photoresist layer PR1 is removed, and a photoresist layer PR2 is formed and patterned on the pre-doping oxide layer 30 so that the pre-doping oxide layer 30 above a region that is to be a collector region in the N well 12a is exposed. Subsequently, a collector region C is formed by doping $N^+$-type ions into the N well 12a.

Figure 1D:
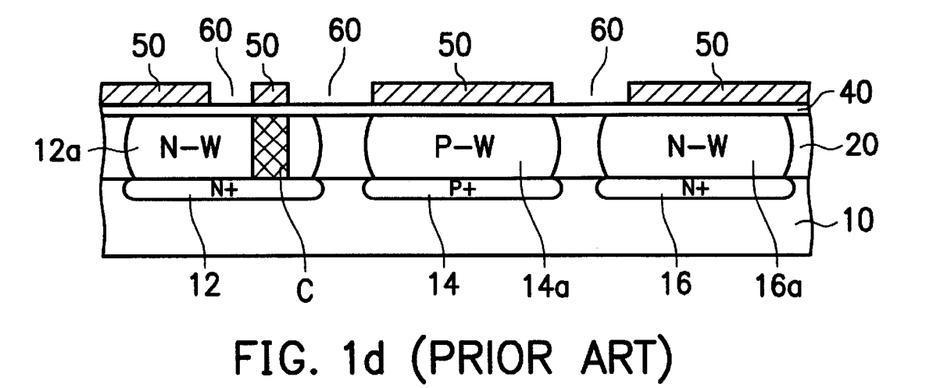

Referring to FIG. 1d, the patterned photoresist layer PR2 and the pre-doping oxide layer 30 are removed, and a pad oxide layer 40 is then formed on the epitaxy layer 20. Subsequently, a silicon nitride layer 50 is formed and defined by photolithography and etching processes to form openings 60 exposing the pad oxide layer 40.

Figure 1E:
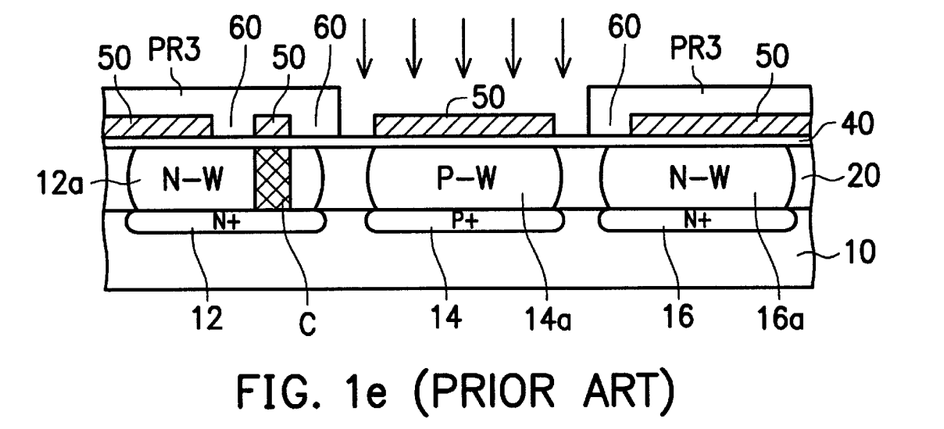

Referring to FIG. 1e, a photoresist layer PR3 is coated and patterned to expose the pad oxide layer 40 and the patterned silicon nitride layer 50 above a region that is to be a P well. Thereafter, a P well 14a is formed by doping $P^+$-type ions into the epitaxy layer 20 above the $P^+$-type buried layer 14.

Figure 1F:
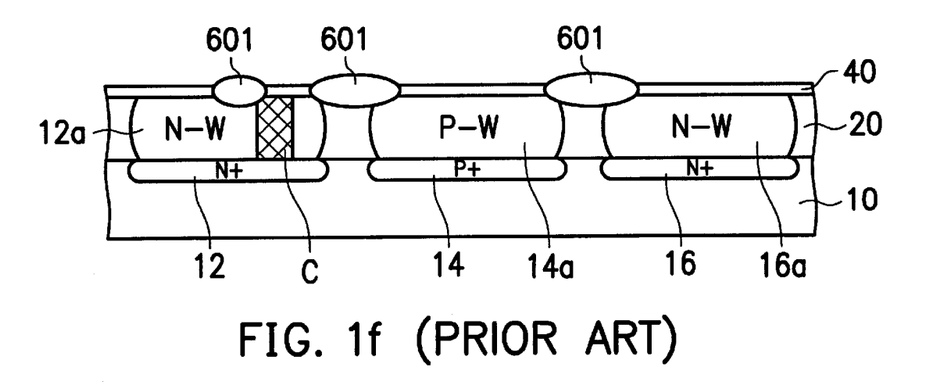

Referring to FIG. 1f, the patterned photoresist layer PR3 is removed, and field oxide layers 601 are formed in the openings 60 by local oxidation (LOCOS). Subsequently, the patterned silicon nitride layer 50 is removed.

The method as described above mainly utilizes the field oxide layer to isolate the N well, the collector region, and the P well, thereby decreasing the junction capacitance. However, the field oxide layer causes the Bird's Beak effect so that the integration of the semiconductor can't be increased. Furthermore, the isolating effect is poor.

SUMMARY OF THE INVENTION

Accordingly, the object of the present invention is to provide an isolating method that can solve the problems mentioned above.

To achieve the above-mentioned object, a method for fabricating an isolation trench applied in BiCMOS processes on a semiconductor substrate is provided. The method comprises the following steps: forming a first oxide layer on the semiconductor substrate to isolate a bipolar junction transistor (BJT) region, a first MOS transistor region, and a second MOS transistor region, wherein the second MOS transistor region is formed between the BJT region and the first MOS transistor region; forming a buried layer of a first conductivity type in the BJT region and the first MOS transistor region, and forming a buried layer of a second conductivity type in the second MOS transistor region; forming an epitaxy layer on the buried layers of the first and the second conductivity type, and forming a polysilicon layer on the first oxide layer; forming a second oxide layer on the polysilicon layer; forming a first well and a second well of a first conductivity type in the epitaxy layer above the BJT region and the first MOS transistor region; forming a collector region in the first well; forming a third well of a second conductivity type in the epitaxy layer above the second MOS transistor region; forming an etching stop layer on the second oxide layer, the first well and the second well, conformally; forming a first trench and a second trench exposing the surface of the first oxide layer by removing the etching stop layer, the second oxide layer, and the polysilicon layer, wherein the etching stop layer is formed above the second oxide layer, and forming a third trench by removing the etching stop layer adjacent to the collector region in the first well; filling a third oxide layer into the first, the second, and the third trench for isolating, and removing the remaining etching stop layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 2A:
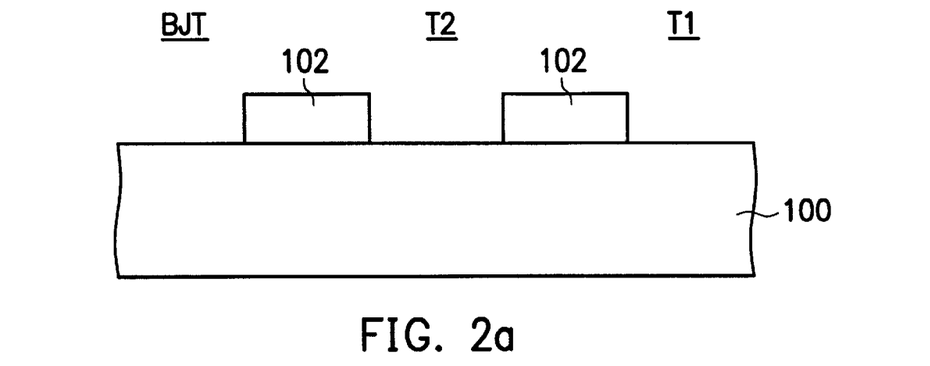
FIG. 2a through FIG. 2k schematically depict in cross-sectional view steps involved in a method for fabricating an isolation trench applied in BiCMOS processes according to the present invention.

Referring to FIG. 2a, a semiconductor substrate 100 such as a P-type silicon substrate is provided. Then an oxide layer 102 is formed to isolate a bipolar junction transistor region BJT and MOS transistor regions T1, T2, wherein the MOS transistor region T2 is formed between the bipolar junction transistor region BJT and the MOS transistor region T1. For example, an oxide layer (not shown) is formed by thermal oxidation. Subsequently, the oxide layer is defined by photolithography and etching processes so that a patterned oxide layer 102 is formed, and the bipolar junction transistor region BJT and MOS transistor regions T1 and T2 are isolated.

Figure 2B:
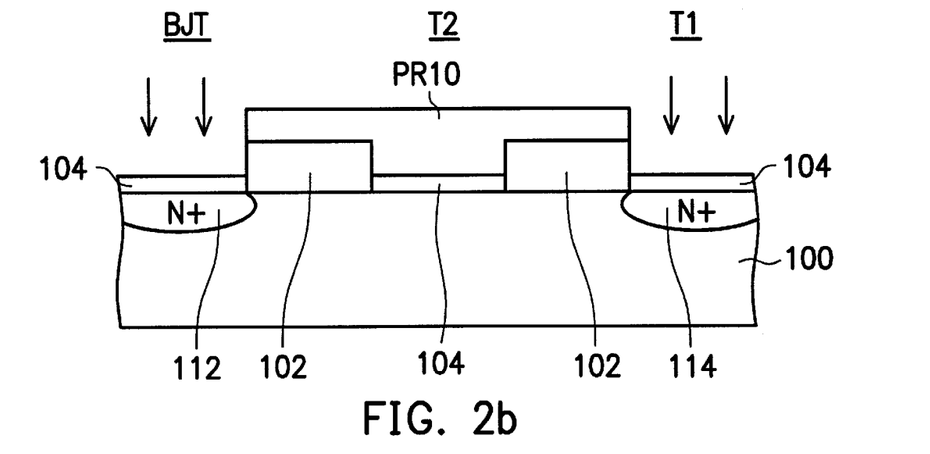
Figure 2C:
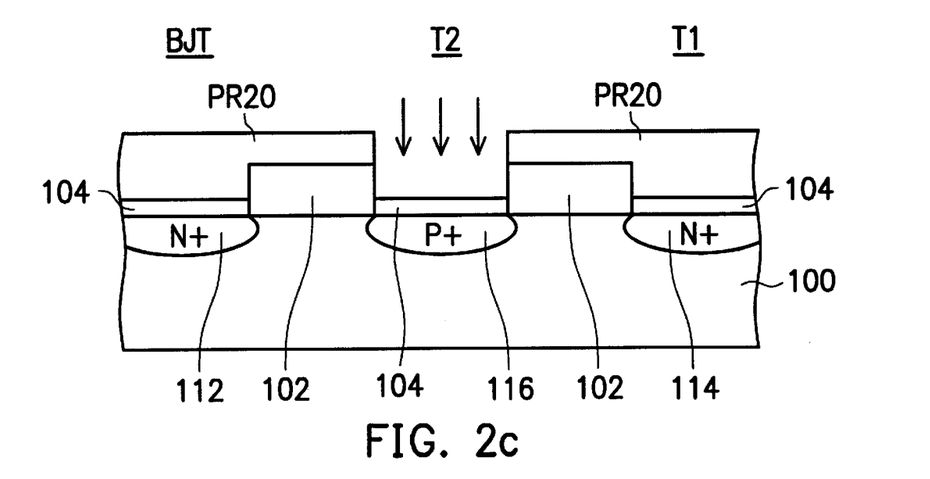

Referring to FIG. 2b and FIG. 2c, the step of forming two N$^+$-type buried layers 112, 114 in the bipolar junction transistor region BJT and the MOS transistor region T1, and the step of forming a P$^+$-type buried layer 116 in the MOS transistor region T2 are shown. For example, as FIG. 2a shows, a pre-doping oxide layer 104 is formed by thermal oxidation in the bipolar junction transistor region BJT and the MOS transistor regions T1 and T2. After coating a photoresist layer (not shown) on the patterned oxide layer 102 and the pre-doping oxide layer 104, a patterned photoresist layer PR10 is formed after the exposure and development processes such that the pre-doping oxide layer 104 above the bipolar junction transistor region BJT and the MOS transistor region T1 is exposed. Thereafter, N$^+$-type buried layers 112 and 114 are formed by doping N$^+$-type ions into the bipolar junction transistor region BJT and the MOS transistor region T1. Referring to FIG. 2c, the patterned photoresist layer PR10 is removed, and a photoresist layer (not shown) is coated on the patterned oxide layer 102 and the pre-doping oxide layer 104 once again. After the exposure and development processes, a patterned photoresist layer PR20 is formed such that the pre-doping oxide layer 104 above the MOS transistor region T2 is exposed. Subsequently, a P$^+$-type buried layer 116 is formed by doping P$^+$-type ions into the MOS transistor region T2.

Figure 2D:
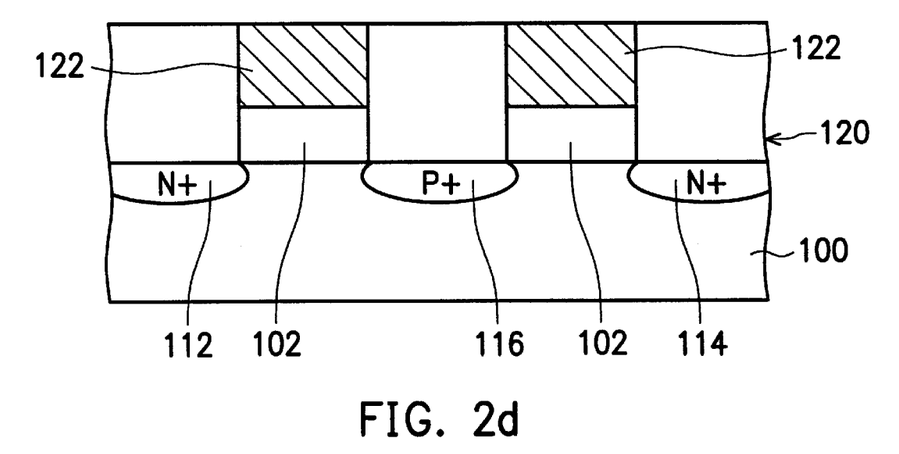

Referring to FIG. 2d, after dry etching the pre-doping oxide layer 104, an epitaxy layer 120 is formed on the N$^+$-type buried layers 112, 114, and the P$^+$-type buried layer 116, and a polysilicon layer 122 is formed on the oxide layer 102. For example, the epitaxy layer 120 and the polysilicon layer 122 are formed by selective epitaxial growth (SEG).

Figure 2E:
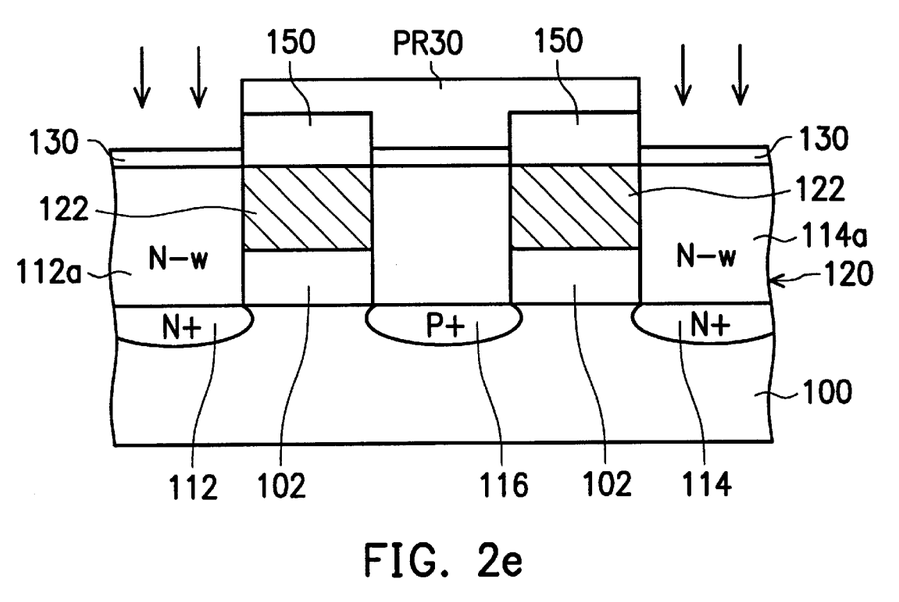

Referring to FIG. 2e, N wells 112a and 114a are formed in the epitaxy layer 120. For example, an oxide layer 150 is formed and defined by thermal oxidation and photolithography and etching processes on the polysilicon layer 122. Subsequently, a pre-doping oxide layer 130 is formed on the epitaxy layer 120 by thermal oxidation. After coating and patterning a photoresist layer (not shown) on the pre-doping oxide layer 130 and the oxide layer 150, a photoresist layer PR30 is formed so that the pre-doping oxide layer 130 above the N$^+$-type buried layers 112 and 114 is exposed.

Thereafter, N wells (N-w) 112a and 114a are formed by doping N-type ions into the epitaxy layer 120 not covered by the photoresist layer PR30.

Figure 2F:
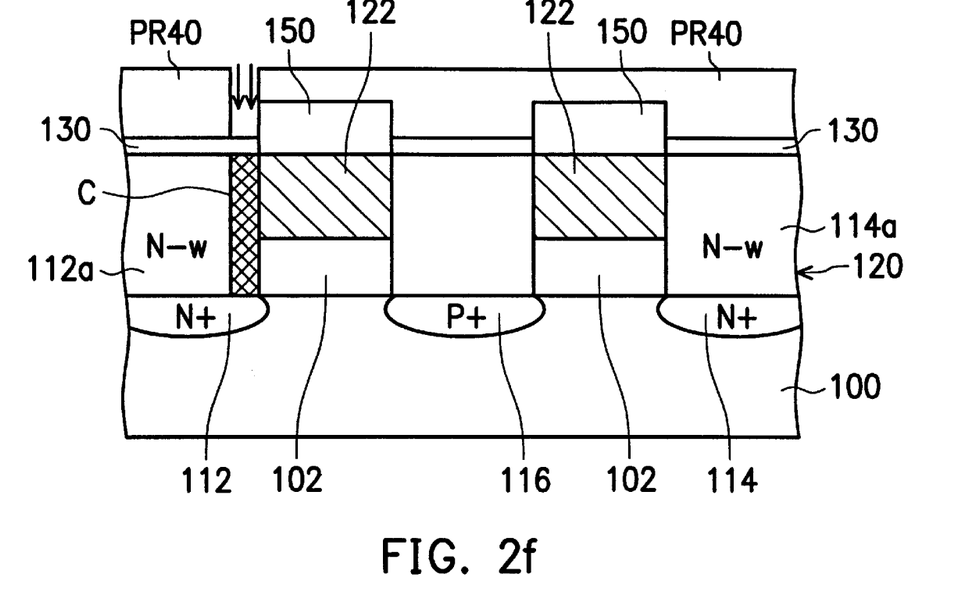

Referring to FIG. 2f, a collector region C is formed adjacent to the polysilicon layer 122 and the oxide layer 102 in the N well 112a. For example, after removing the photoresist layer PR30, a photoresist layer PR40 is coated and patterned on the pre-doping oxide layer 130 and the oxide layer 150 to expose the pre-doping oxide layer 130 above a region that is to be a collector region adjacent to the polysilicon layer 122 and the oxide layer 102 in the N well 112a. Subsequently, a collector C is formed by doping N$^+$-type ions into the region that is to be a collector.

Figure 2G:
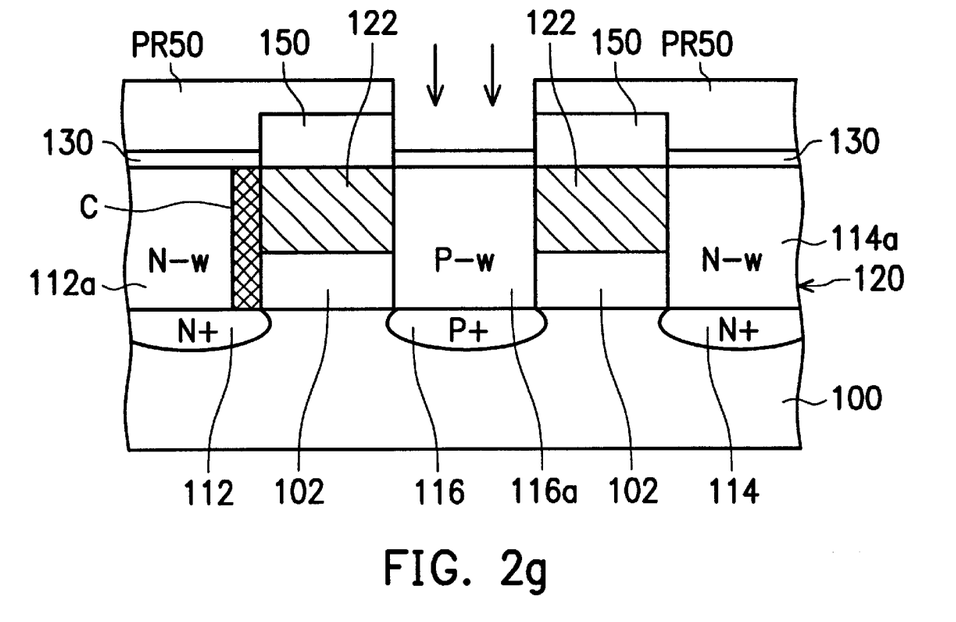

Referring to FIG. 2g, a P well 116a is formed in the epitaxy layer 120 above the P$^+$-type buried layer 116. For example, the photoresist layer PR40 is removed, and a photoresist layer PR50 is coated and patterned on the pre-doping oxide layer 130 and the oxide layer 150 so that the pre-doping oxide layer 130 above the P$^+$-type buried layer 116 is exposed. N$^+$-type ions are then doped into the epitaxy layer 120 above the P$^+$-type buried layer 116 to form a P well 116a (P-w)

Figure 2H:
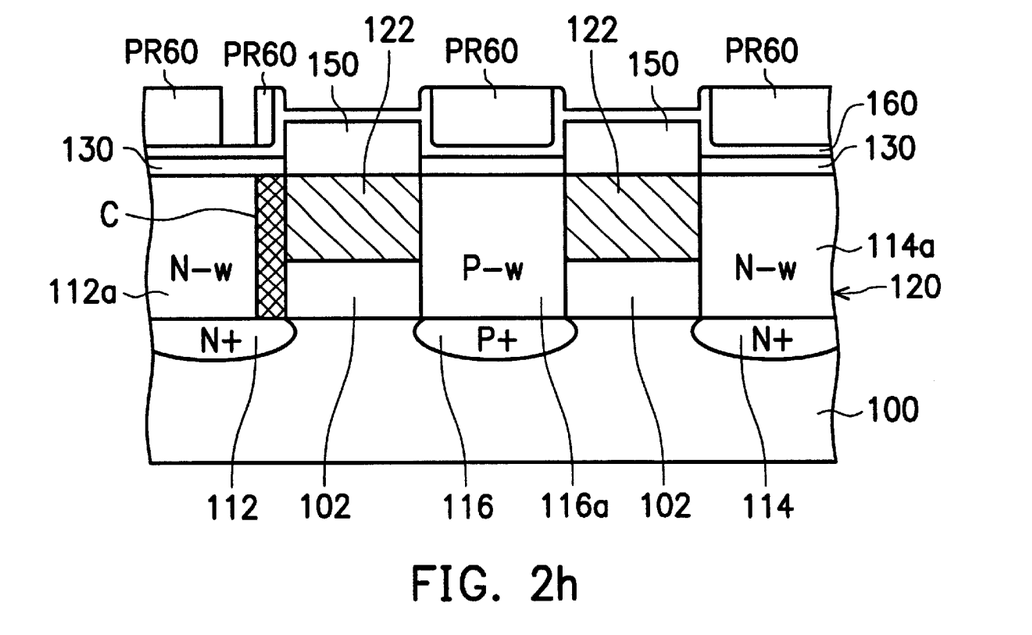
Figure 2I:
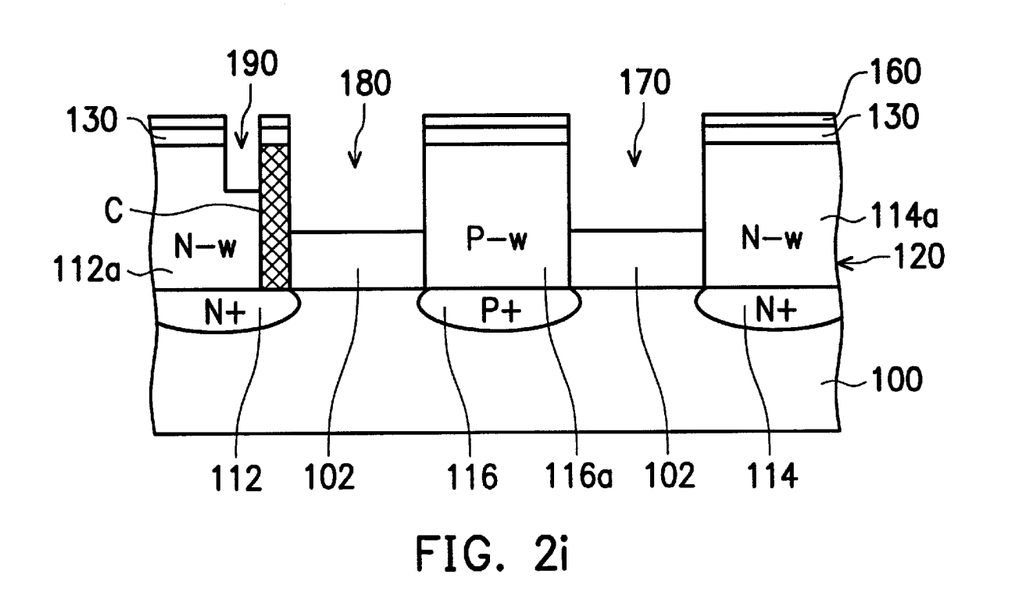

Referring to FIG. 2h and FIG. 2i, isolation trenches 170, 180, and 190 are formed above the oxide layer 102 and in the N well 112a adjacent to the collector region C. For example, as FIG. 2h shows, after removing the patterned photoresist layer PR50, an etching stop layer 160 such as a silicon nitride layer is formed to be an etching stop layer for a following CMP (chemical mechanical polishing) process. Subsequently, a photoresist layer PR60 is coated and patterned on the etching stop layer (i.e. the silicon nitride layer) 160 to expose the etching stop layer 160 above the oxide layer 150 and the N well 112a adjacent to the collector C.

Referring to FIG. 2i, the silicon nitride layer 160, the oxide layer 150, and the polysilicon layer 122 are etched and stopped at the oxide layer 102 to form trenches 170 and 180 in accordance with the pattern of the mask of photoresist layer PR60, while the pre-doping oxide layer 130 and the epitaxy layer 120 in the N well 112a adjacent to the collector C are removed to form a trench 190 in accordance with the pattern of the mask of photoresist layer PR60. Thereafter, the patterned photoresist layer PR60 is removed.

Figure 2J:
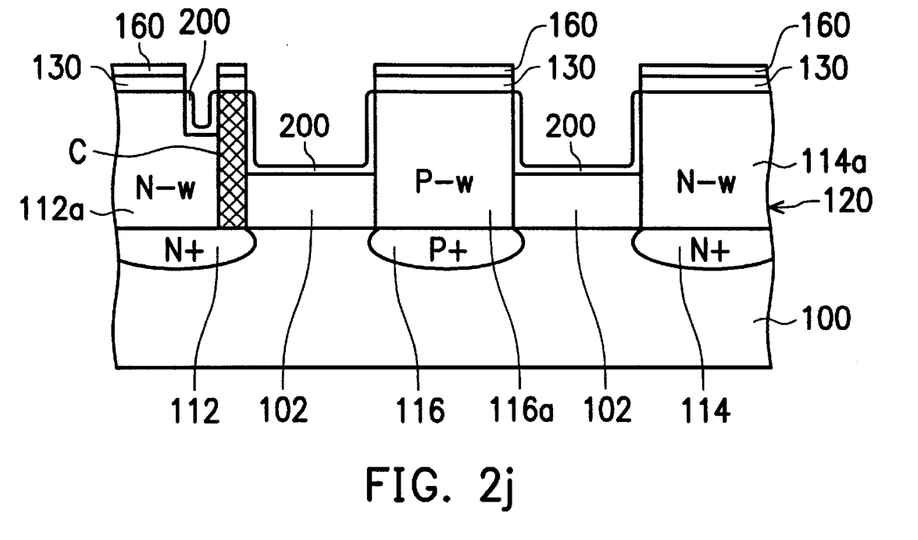

Please refer to FIG. 2j, wherein a drive-in step of the well regions is performed and an isolating oxide layer 200 formed in the inner side-walls of the trenches 170, 180, and 190 by thermal oxidation is shown.

Figure 2K:
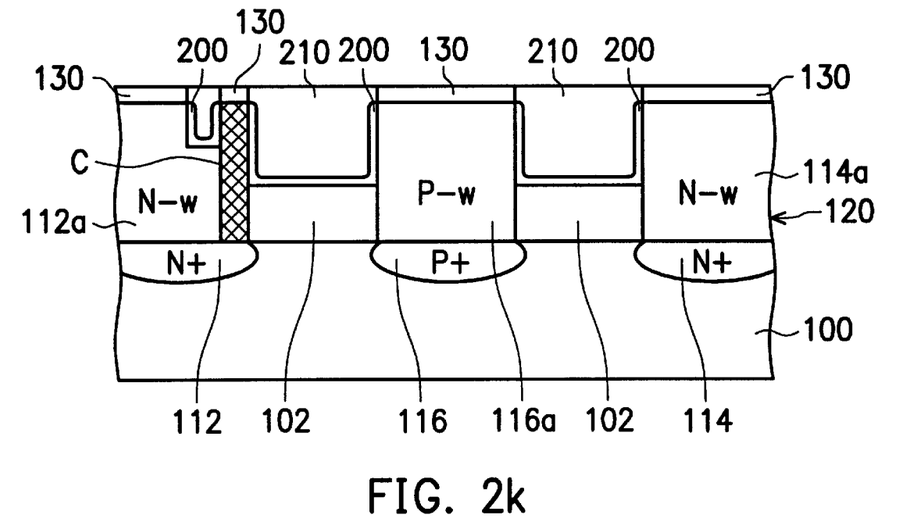

Referring to FIG. 2k, an oxide layer 210 is formed in the trenches 170, 180, and 190 so that the N well 112a, the collector C, the P well 116a, and the N well 114a are isolated. For example, a TEOS layer (not shown) is formed on the silicon nitride layer 160 and filled into the trenches 170, 180, and 190 by a CVD (chemical vapor deposition) process. Subsequently, isolation trenches 210 are formed by a planarization process such as a CMP or an etching back process, wherein the planarization process stops at the etching stop layer (i.e. the silicon nitride layer) 160. The silicon nitride layer 160 is then removed by wet etching, so that isolation trenches 210 are formed.

As previously discussed, the isolation trenches 210 are formed initially by defining the oxide layer 102 formed on the semiconductor substrate 100. Then, the epitaxy layer 120 is formed on the substrate 100 and the polysilicon layer 122 is formed on the oxide layer 102 by selective epitaxial growth (SEG). After forming the well regions 112a, 114a, 116a, and the collector C in the epitaxy layer 120, the polysilicon layer 122 is etched and stopped at the oxide layer 102. Thus, the processes are simplified compared to those of the prior art. In addition, the integration of the semiconductor is increased, and the isolating effect is good.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating an isolation trench applied in BiCMOS processes on a semiconductor substrate, comprising the following steps:

forming a first oxide layer on the semiconductor substrate to isolate a bipolar junction transistor (BJT) region, a first MOS transistor region, and a second MOS transistor region, wherein the second MOS transistor region is formed between the BJT region and the first MOS transistor region;

forming a buried layer of a first conductivity type in the BJT region and the first MOS transistor region, and forming a buried layer of a second conductivity type in the second MOS transistor region;

forming an epitaxy layer on the buried layers of the first and the second conductivity type, and forming a polysilicon layer on the first oxide layer;

forming a second oxide layer on the polysilicon layer;

forming a first well and a second well of a first conductivity type in the epitaxy layer above the BJT region and the first MOS transistor region;

forming a collector region in the first well;

forming a third well of a second conductivity type in the epitaxy layer above the second MOS transistor region;

forming an etching stop layer on the second oxide layer, the first well and the second well, conformally;

forming a first trench and a second trench exposing the surface of the first oxide layer by removing the etching stop layer, the second oxide layer, and the polysilicon layer, and forming a third trench by removing the etching stop layer adjacent to the collector region in the first well;

filling a third oxide layer into the first, the second, and the third trench for isolating; and removing the remaining etching stop layer.

2. The method as claimed in claim 1, wherein the first oxide layer is formed by thermal oxidation.

3. The method as claimed in claim 1, wherein the first MOS transistor region and the second MOS transistor region form a CMOS transistor region.

4. The method as claimed in claim 1, wherein the first conductivity type is P type, while the second conductivity type is N type.

5. The method as claimed in claim 1, wherein the first conductivity type is N type, while the second conductivity type is P type.

6. The method as claimed in claim 1, wherein the epitaxy layer and the polysilicon layer are formed by selective epitaxial growth(SEG).

7. The method as claimed in claim 1, further comprising the steps of:

predepositing an oxide layer on the semiconductor substrate; and forming a buried layer of a first conductivity type in the BJT region and the first MOS transistor region, and forming a buried layer of a second conductivity type in the second MOS transistor region by ion implantation.

8. The method as claimed in claim 1, further comprising the steps of:

predepositing an oxide layer on the semiconductor substrate; and forming a first well and a second well of a first conductivity type by ion implantation in the epitaxy layer above the BJT region and the first MOS transistor region.

9. The method as claimed in claim 1, wherein the etching stop layer is a silicon nitride layer.

10. The method as claimed in claim 9, wherein the step of filling a third oxide layer into the first, the second, and the third trench for isolating further comprises:

depositing an oxide layer to cover the semiconductor substrate and the first, the second, and the third trenches; and planarizing the oxide layer.

11. The method as claimed in claim 1, further comprising forming an oxide layer on the first, the second, and the third trenches by thermal oxidation.

* * * * *